(12) United States Patent
Corman et al.

(10) Patent No.: US 8,416,882 B2
(45) Date of Patent: Apr. 9, 2013

(54) DIGITAL AMPLITUDE CONTROL OF VECTOR GENERATOR

(75) Inventors: David W. Corman, Gilbert, AZ (US); Jennifer Kitchen, Scottsdale, AZ (US)

(73) Assignee: ViaSat, Inc., Carlsbad, CA (US)

( * ) Notice: Subject to any disclaimer, the term of this patent is extended or adjusted under 35 U.S.C. 154(b) by 263 days.

(21) Appl. No.: 12/759,113

(22) Filed: Apr. 13, 2010

(65) Prior Publication Data

US 2010/0260285 A1  Oct. 14, 2010

Related U.S. Application Data

(60) Provisional application No. 61/237,967, filed on Aug. 28, 2009, provisional application No. 61/259,375, filed on Nov. 9, 2009, provisional application No. 61/234,513, filed on Aug. 17, 2009, provisional application No. 61/222,354, filed on Jul. 1, 2009, provisional application No. 61/168,913, filed on Apr. 13, 2009, provisional application No. 61/259,049, filed on Nov. 6, 2009, provisional application No. 61/234,521, filed on Aug. 17, 2009, provisional application No. 61/265,605, filed on Dec. 1, 2009, provisional application No. 61/222,363, filed on Jul. 1, 2009.

(51) Int. Cl.
*H04K 1/02* (2006.01)
*H04L 25/49* (2006.01)

(52) U.S. Cl.
USPC ............ 375/296; 375/146; 375/299; 375/301

(58) Field of Classification Search .................. 375/297, 375/295, 296
See application file for complete search history.

(56) References Cited

U.S. PATENT DOCUMENTS

| 3,119,965 A | 1/1964 | Phillips |
| 4,857,777 A | 8/1989 | Altes |
| 4,896,374 A | 1/1990 | Waugh et al. |

(Continued)

FOREIGN PATENT DOCUMENTS

| EP | 0762660 | 3/1997 |
| EP | 1193861 | 4/2002 |

(Continued)

OTHER PUBLICATIONS

Office Action dated Feb. 27, 2012 in U.S. Appl. No. 12/759,130.

(Continued)

*Primary Examiner* — Daniel Washburn
*Assistant Examiner* — Qutbuddin Ghulamali
(74) *Attorney, Agent, or Firm* — Snell & Wilmer LLP

(57) ABSTRACT

In an exemplary embodiment, an active vector generator is configured to generate a composite vector with controlled phase and amplitude, where the active vector generator generates the composite vector with independent variable phase control and independent variable amplitude control. Furthermore, in another exemplary embodiment, an active vector generator is configured to generate a unique number of phase states and configured to generate a unique number of amplitude states. Specifically, an exemplary active vector generator comprises a digital-to-analog converter (DAC) configured to set the phase of the composite vector, a current multiplying switch network configured to control the amplitude of the composite vector, a variable current multiplier configured to adjust the amplitude of the composite vector, and a differential adder configured to control the quadrant of the composite vector and generate the composite vector.

20 Claims, 5 Drawing Sheets

U.S. PATENT DOCUMENTS

| | | | |
|---|---|---|---|
| 4,965,602 | A | 10/1990 | Kahrilas et al. |
| 4,994,773 | A | 2/1991 | Chen et al. |
| 5,045,822 | A * | 9/1991 | Mohwinkel .................... 333/124 |
| 5,270,719 | A | 12/1993 | Roth |
| 5,942,929 | A | 8/1999 | Aparin |
| 5,966,049 | A * | 10/1999 | Yuen et al. .................... 330/149 |
| 6,005,515 | A | 12/1999 | Allen et al. |
| 6,061,553 | A | 5/2000 | Matsuoka et al. |
| 6,232,837 | B1 | 5/2001 | Yoo et al. |
| 6,326,845 | B1 | 12/2001 | Miyaji et al. |
| 7,319,345 | B2 | 1/2008 | Farjad-rad et al. |
| 7,355,470 | B2 | 4/2008 | Sorrells et al. |
| 7,378,902 | B2 | 5/2008 | Sorrells et al. |
| 7,400,193 | B2 | 7/2008 | Wyatt |
| 7,408,507 | B1 | 8/2008 | Paek et al. |
| 7,420,423 | B2 * | 9/2008 | Lee et al. .................... 330/301 |
| 7,421,036 | B2 | 9/2008 | Sorrells et al. |
| 7,620,129 | B2 | 11/2009 | Sorrells et al. |
| 7,672,653 | B2 | 3/2010 | Cowley et al. |
| 7,728,784 | B2 | 6/2010 | Mohamadi |
| 7,746,764 | B2 | 6/2010 | Rawlins et al. |
| 7,750,733 | B2 | 7/2010 | Sorrells et al. |
| 7,755,430 | B2 | 7/2010 | Imagawa |
| 7,817,757 | B2 * | 10/2010 | Hidaka .................... 375/350 |
| 7,885,682 | B2 | 2/2011 | Sorrells et al. |
| 8,013,784 | B2 | 9/2011 | Margomenos et al. |
| 2002/0113648 | A1 | 8/2002 | Miyaji et al. |
| 2003/0016085 | A1 | 1/2003 | Yamazaki |
| 2003/0162566 | A1 | 8/2003 | Shapira et al. |
| 2004/0095190 | A1 | 5/2004 | Klaren |
| 2004/0121750 | A1 | 6/2004 | Nation |
| 2004/0229584 | A1 | 11/2004 | Fischer et al. |
| 2005/0113052 | A1 | 5/2005 | Rabinovich |
| 2005/0151698 | A1 | 7/2005 | Mohamadi |
| 2006/0170499 | A1 | 8/2006 | Rahman et al. |
| 2007/0248186 | A1 | 10/2007 | Sorrells et al. |
| 2007/0275674 | A1 | 11/2007 | Chein |
| 2007/0280384 | A1 | 12/2007 | Hidaka |
| 2008/0129408 | A1 | 6/2008 | Nagaishi et al. |
| 2008/0129634 | A1 | 6/2008 | Pera |
| 2008/0218424 | A1 * | 9/2008 | Blanton .................... 343/756 |
| 2009/0091384 | A1 | 4/2009 | Sorrells et al. |
| 2010/0039174 | A1 | 2/2010 | Teetzel |
| 2010/0073085 | A1 | 3/2010 | Sorrells et al. |
| 2010/0097138 | A1 | 4/2010 | Sorrells et al. |
| 2010/0225389 | A1 | 9/2010 | Teetzel |
| 2010/0321107 | A1 | 12/2010 | Honcharenko |

FOREIGN PATENT DOCUMENTS

| | | |
|---|---|---|
| JP | 2003168938 | 6/2003 |
| WO | WO9945609 | 8/1999 |
| WO | WO0003456 | 1/2000 |
| WO | WO0241442 | 5/2002 |
| WO | WO03036756 | 5/2003 |

OTHER PUBLICATIONS

Notice of Allowance dated Feb. 28, 2012 in U.S. Appl. No. 12/759,059.

Office Action dated Aug. 2, 2012 in U.S. Appl. No. 12/758,996.

Notice of Allowance dated May 10, 2012 in U.S. Appl. No. 12/759,130.

Office Action dated May 17, 2012 in U.S. Appl. No. 12/759,043.

Supplemental Notice of Allowability dated May 29, 2012 in U.S. Appl. No. 12/759,130.

Office Action dated May 29, 2012 in U.S. Appl. No. 12/759,123.

Final Office Action dated Jun. 5, 2012 in U.S. Appl. No. 12/759,148.

Supplemental Notice of Allowability dated Jun. 11, 2012 in U.S. Appl. No. 12/759,130.

International Search Report and Written Opinion dated Jul. 19, 2010,PCT US10/030881, 149 pages.

International Search Report and Written Opinion dated Aug. 23, 2010, PCT/US2010/30864,12 pages.

Kwang-Jin, Koh, Gabriel M. Rebeiz, 0.13-mu m CMOS phase shifters for X-, Ku, and K-band phased arrays, IEEE Journal of Solid State Circuits, 2007, 14 pages.

Kwang-Jin, Koh, Jason W. May, Gabriel M. Rebeiz A Q-Band (40-45 GHz) 16-Element Phased-Array Transmitter in 0.18-μm SiGe BiCMOS Technology, IEEE Radio Frequency Integrated Circuits Symposium, 2008, 4 pages.

Kwang-Jin, Koh, Gabriel M. Rebeiz, An X- and Ku-Band 8-Element Phased-Array Receiver in 0.18-μm SiGe BiCMOS Technology, IEEE Journal of Solid State Circuits, Jun. 2008, 12 pages.

International Preliminary Report on Patentability dated Jul. 21, 2011 from PCT/US2010/030877.

International Preliminary Report on Patentability dated Jul. 21, 2011 from PCT/US10/30906.

International Preliminary Report on Patentability dated Jul. 21, 2011 from PCT/US10/30892.

Office Action dated Sep. 29, 2011 from U.S. Appl. No. 12/759,059.

International Preliminary Report dated Oct. 27, 2011 from PCT/US10/030864.

International Preliminary Report dated Oct. 27, 2011 from PCT/US10/30868.

International Preliminary Report dated Oct. 27, 2011 from PCT/US10/030881.

International Preliminary Report dated Oct. 27, 2011 from PCT/US10/30872.

International Preliminary Report dated Oct. 27, 2011 from PCT/US10/30871.

International Preliminary Report dated Oct. 27, 2011 from PCT/US10/30866.

International Preliminary Report dated Oct. 27, 2011 from PCT/US10/030876.

Office Action dated Jan. 4, 2012 from U.S. Appl. No. 12/759,148.

Notice of Allowance dated Jul. 27, 2011 in U.S. Appl. No. 12/759,064.

USPTO; Office Action dated Apr. 7, 2011 in U.S. Appl. No. 12/759,064.

Zheng et al., "Full 360 degree Vector-Sum Phase-Shifter for Microwave System Applications," IEEE Transactions on Circuits and Systems I: Regular Papers, Downloaded on Jul. 8, 2009, pp. 1-7.

Ayari et al., "Automatic Test Vector Generation for Mixed-Signal Circuits," 1995, Ecole Polytechnique of the University of Montreal, 6 pages.

Strassberg, Dan, "RF-vector-signal generator combines high throughput, low phase noise," EDN, Oct. 6, 2009, 2 pages, UBM Electronics.

International Search Report and Written Opinion dated Oct. 27, 2010, PCT/US10/030876, 8 pages.

International Search Report and Written Opinion dated Nov. 18, 2010, PCT/US10/30871, 10 pages.

International Search Report and Written Opinion dated Nov. 26, 2010, PCT/US10/30868, 10 pages.

International Search Report and Written Opinion dated Nov. 26, 2010, PCT/US10/30877, 10 pages.

Tokumitsu et al.—Active isolator, combiner, divider and magic-T as miniaturized function blocks dated Nov. 6, 1998.

International Search Report and Written Opinion dated Nov. 26, 2010, PCT/US10/30866, 8 pages.

Aminghasem Safarian et al., Distributed Active Power Combiners and Splitters for Multi-Antenna UWB.

Viallon et al. An Original SiGe Active Differential Output Power Splitter for Millimetre-wave Applications, 2003.

International Search Report and Written Opinion dated Nov. 26, 2010, PCT/US10/30892, 9 pages.

International Search Report and Written Opinion dated Nov. 26, 2010, PCT/US10/30872, 9 pages.

Hsiao Analysis of Interleaved Arrays of Nov. 1971.

International Search Report and Written Opinion dated Nov. 30, 2010, PCT/US10/30906, 11 pages.

Aminghasem Safarian et al., "Distributed Active Power Combiners and Splitters for Multi-Antenna UWB Transceivers" Sep. 2006, pp. 138-141.

Notice of Allowance dated Aug. 14, 2012 in U.S. Appl. No. 12/759,123.

Notice of Allowance dated Aug. 20, 2012 in U.S. Appl. No. 12/759,148.

Final Office Action dated Sep. 17, 2012 in U.S. Appl. No. 12/759,043.

Notice of Allowance dated Nov. 8, 2012 in U.S. Appl. No. 12/759,043.

Notice of Allowance dated Dec. 6, 2012 in U.S. Appl. No. 13/540,394.

Office Action dated Dec. 19, 2012 in U.S. Appl. No. 12/758,914.

Notice of Allowance dated Jan. 30, 2013 in U.S. Appl. No. 12/758,996.

* cited by examiner

US 8,416,882 B2

DIGITAL AMPLITUDE CONTROL OF VECTOR GENERATOR

CROSS REFERENCE TO RELATED APPLICATIONS

This application is a non-provisional of U.S. Provisional Application No. 61/237,967, entitled "ACTIVE BUTLER AND BLASS MATRICES," which was filed on Aug. 28, 2009. This application is also a non-provisional of U.S. Provisional Application No. 61/259,375, entitled "ACTIVE HYBRIDS FOR ANTENNA SYSTEMS," which was filed on Nov. 9, 2009. This application is a non-provisional of U.S. Provisional Application No. 61/234,513, entitled "ACTIVE FEED FORWARD AMPLIFIER," which was filed on Aug. 17, 2009. This application is a non-provisional of U.S. Provisional Application No. 61/222,354, entitled "ACTIVE PHASED ARRAY ARCHITECTURE," which was filed on Jul. 1, 2009. This application is a non-provisional of U.S. Provisional Application No. 61/168,913, entitled "ACTIVE COMPONENT PHASED ARRAY ANTENNA," which was filed on Apr. 13, 2009. This application is also a non-provisional of U.S. Provisional Application No. 61/259,049, entitled "DYNAMIC REAL-TIME POLARIZATION FOR ANTENNAS," which was filed on Nov. 6, 2009. This application is a non-provisional of U.S. Provisional Application No. 61/234,521, entitled "MULTI-BAND MULTI-BEAM PHASED ARRAY ARCHITECTURE," which was filed on Aug. 17, 2009. This application is a non-provisional of U.S. Provisional Application No. 61/265,605, entitled "HALF-DUPLEX PHASED ARRAY ANTENNA SYSTEM," which was filed on Dec. 1, 2009. This application is a non-provisional of U.S. Provisional Application No. 61/222,363, entitled "BIDIRECTIONAL ANTENNA POLARIZER," which was filed on Jul. 1, 2009. All of the contents of the previously identified applications are hereby incorporated by reference for any purpose in their entirety.

BACKGROUND OF THE INVENTION

A phased array antenna uses multiple radiating elements to transmit, receive, or transmit and receive radio frequency (RF) signals. Phased array antennas are used in various capacities, including communications on the move (COTM) antennas, satellite communication (SATCOM) airborne terminals, SATCOM mobile communications, and SATCOM earth terminals. The application of mobile terminals typically requires the use of automatic tracking antennas that are able to steer the beam in azimuth, elevation, and polarization to follow the satellite position while the vehicle is in motion.

One well known type of phased array antenna is an electronically steerable phased array antenna. The electronically steerable phased array antenna has full electronic steering capability and is more compact and lower profile than a comparable mechanical phased array antenna. The main drawback of fully electronic steering is that the antenna usually requires the integration of a lot of expensive analog RF electronic components which may prohibitively raise the cost for commercial applications. A typical electronically steerable phased array antenna comprises an assembly of phase shifters, power splitters, power combiners, and quadrature hybrids. Additionally, a typical electronically steerable phased array requires at least a few of these components at every element in the phased array, which increases the cost and complexity of the architecture.

Phase shifters are used in a phased array antenna in order to steer the beam of the signals by controlling the respective phases of the RF signals communicated through the phase shifters. A typical digital phase shifter uses switched delay lines, is physically large, and operates over a narrow band of frequencies due to its distributed nature. Another typical digital phase shifter implements a switched high-pass low-pass filter architecture which has better operating bandwidth compared to a switched delay line but is still physically large.

Also, the phase shifter is often made on gallium arsenide (GaAs). Though other materials may be used, GaAs is a higher quality material designed and controlled to provide good performance of electronic devices. However, in addition to being a higher quality material than the other possible materials, GaAs is also more expensive and more difficult to manufacture. The typical phased array components take up a lot of area on the GaAs, and result in higher costs. Furthermore, a standard phase shifter has high RF loss, which is typically about n+1 dB of loss, where n is the number of phase bits in the phase shifter. Another prior art embodiment uses RF MEMS switches and has lower loss but still consumes similar space and is incompatible with monolithic solutions.

SUMMARY

In an exemplary embodiment, phased array antenna applications implement active vector generators, where the vector generators have amplitude control. In an exemplary embodiment, a vector generator with amplitude control uses a network of current mirror multipliers to digitally vary bias currents supplied to a differential adder. By varying the bias to the differential adder, the amplitude of a resultant vector produced by the network is controllable in binary steps. In an exemplary embodiment, an active vector generator with amplitude control is compatible with multi-beam systems and may be employed over a wide frequency range allowing a single antenna solution to function over multiple operating bands.

Furthermore, in an exemplary embodiment, the addition of amplitude control to the active vector generators allows a variety of system enhancements to be enjoyed. For example, a phased array antenna system may be configured for at least one of amplitude taper for antenna sidelobe management, adaptive nulling for interference rejection, complex beam weighting, and improved array calibration. Moreover, in an exemplary embodiment, a vector generator may also be configured to allow individual beam weights to be turned off, allowing additional system flexibility.

In an exemplary embodiment, an active vector generator is configured to generate a composite vector with controlled phase and amplitude, where the active vector generator generates the composite vector with independent variable phase control and independent variable amplitude control. Furthermore, in another exemplary embodiment, an active vector generator is configured to generate a unique number of phase states and configured to generate a unique number of amplitude states. Specifically, an exemplary active vector generator comprises a digital-to-analog converter (DAC) configured to set the phase of the composite vector, a current multiplying switch network configured to control the amplitude of the composite vector, a variable current multiplier configured to adjust the amplitude of the composite vector, and a differential adder configured to control the quadrant of the composite vector and generate the composite vector.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

DETAILED DESCRIPTION OF THE INVENTION

While exemplary embodiments are described herein in sufficient detail to enable those skilled in the art to practice the invention, it should be understood that other embodiments may be realized and that logical material, electrical, and mechanical changes may be made without departing from the spirit and scope of the invention. Thus, the following detailed description is presented for purposes of illustration only.

In an exemplary embodiment, a vector generator converts an RF input signal into an output signal (sometimes referred to as an output vector) that is shifted in phase and/or amplitude to a desired level. This replaces the function of a typical phase shifter and adds the capability of amplitude control. In other words, a vector generator is a magnitude and phase control circuit. In the exemplary embodiment, the vector generator accomplishes this function by feeding the RF input signal into a quadrature network resulting in two output signals that differ in phase by about 90°. The two output signals are fed into parallel quadrant select circuits, and then through parallel variable gain amplifiers (VGAs). In an exemplary embodiment, the quadrant select circuits receive commands and may be configured to either pass the output signals with no additional relative phase shift between them or invert either or both of the output signals by an additional 180°. In this fashion, all four possible quadrants of the 360° continuum are available to both orthogonal signals. The resulting composite output signals from the current summer are modulated in phase.

Figure 1:
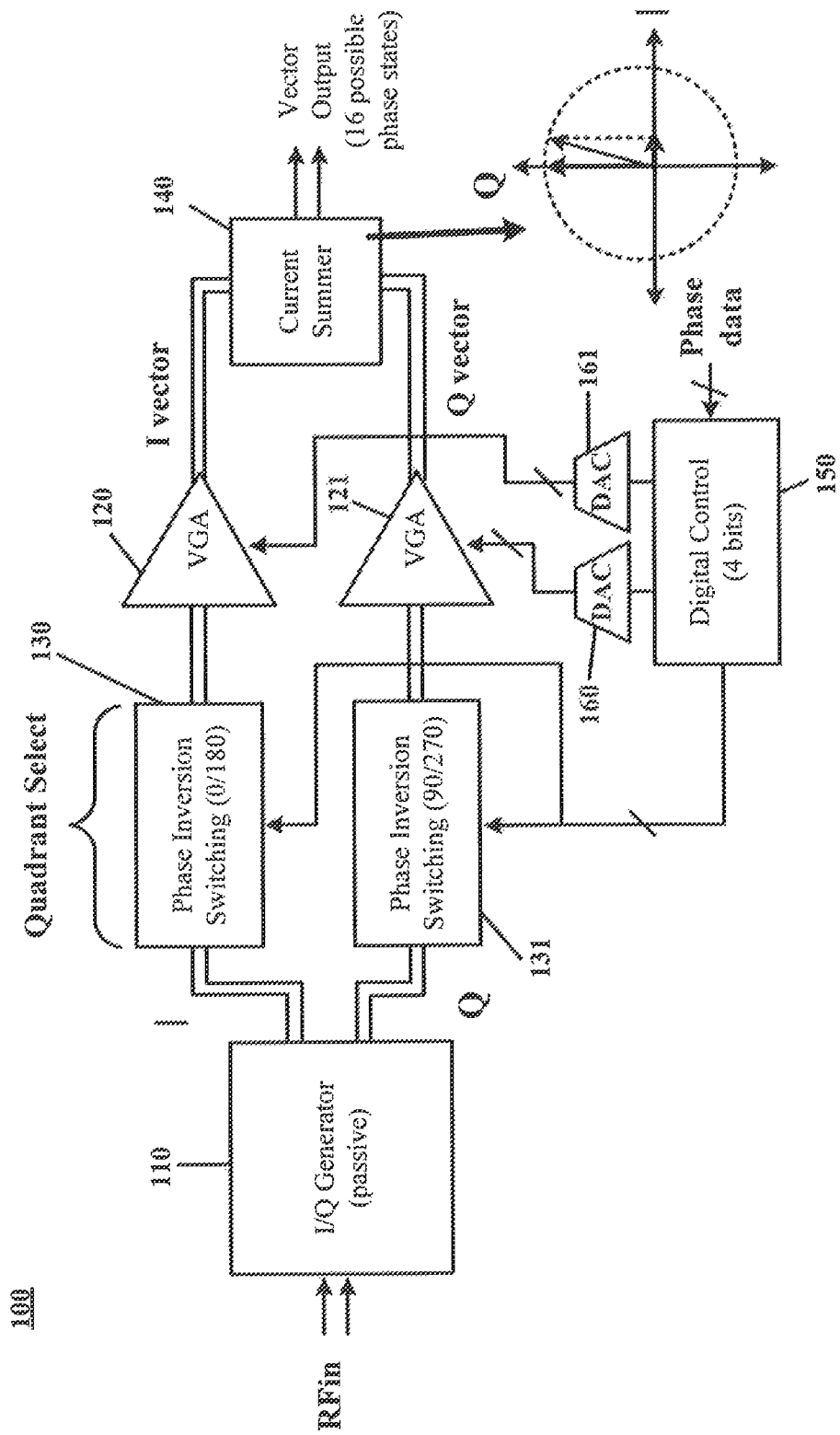
FIG. 1 illustrates an exemplary embodiment of an active vector generator.

In accordance with an exemplary embodiment and with reference to FIG. 1, a vector generator 100 comprises a passive I/Q generator 110, a first VGA 120 and a second VGA 121, a first quadrant select 130 and a second quadrant select 131 each configured for phase inversion switching, and a current summer 140. The first quadrant select 130 is in communication with I/Q generator 110 and first VGA 120. The second quadrant select 131 is in communication with I/Q generator 110 and second VGA 121. Furthermore, in an exemplary embodiment, vector generator 100 comprises a digital controller 150 that controls a first digital-to-analog converter (DAC) 160 and a second DAC 161. The first and second DACs 160, 161 control first and second VGAs 121, 120, respectively. Additionally, digital controller 150 controls first and second quadrant selects 130, 131.

In an exemplary embodiment, vector generator 100 controls the phase and amplitude of an RF signal by splitting the RF signal into two separate vectors, the in-phase (I) vector and the quadrature-phase (Q) vector. In one embodiment, the RF signal is communicated differentially. The differential RF signal communication may be throughout vector generator 100 or limited to various portions of vector generator 100. In another exemplary embodiment, the RF signals are communicated non-differentially. The I vector and Q vector are processed in parallel, each passing through the phase inverting switching performed by first and second quadrant selects 130, 131. The resultant outputs of the phase inverting switches comprise four possible signals: a non-inverted I, an inverted I, a non-inverted Q, and an inverted Q. In this manner, all four quadrants of a phasor diagram are available for further processing by VGAs 120, 121. In an exemplary embodiment, two of the four possible signals non-inverted I, inverted I, non-inverted Q, and inverted Q are processed respectively through VGAs 120, 121, until the two selected signals are combined in current summer 140 to form a composite RF signal. The current summer 140 outputs the composite RF signal with phase and amplitude adjustments. In an exemplary embodiment, the composite RF signal is in differential signal form. In another exemplary embodiment, the composite RF signals are in single-ended form.

In an exemplary embodiment, control for the quadrant shifting and VGA functions is provided by a pair of DACs. In an exemplary embodiment, reconfiguration of digital controller 150 allows the number of phase bits to be digitally controlled after vector generator 100 is fabricated if adequate DAC resolution and automatic gain control (AGC) dynamic range exists. In an exemplary embodiment with adequate DAC resolution and AGC dynamic range, any desired vector phase and amplitude can be produced with selectable fine quantization steps using digital control. In another exemplary embodiment, reconfiguration of DACs 160, 161 can be made after vector generator 100 is fabricated in order to facilitate adjustment of the vector amplitudes.

Figure 2:
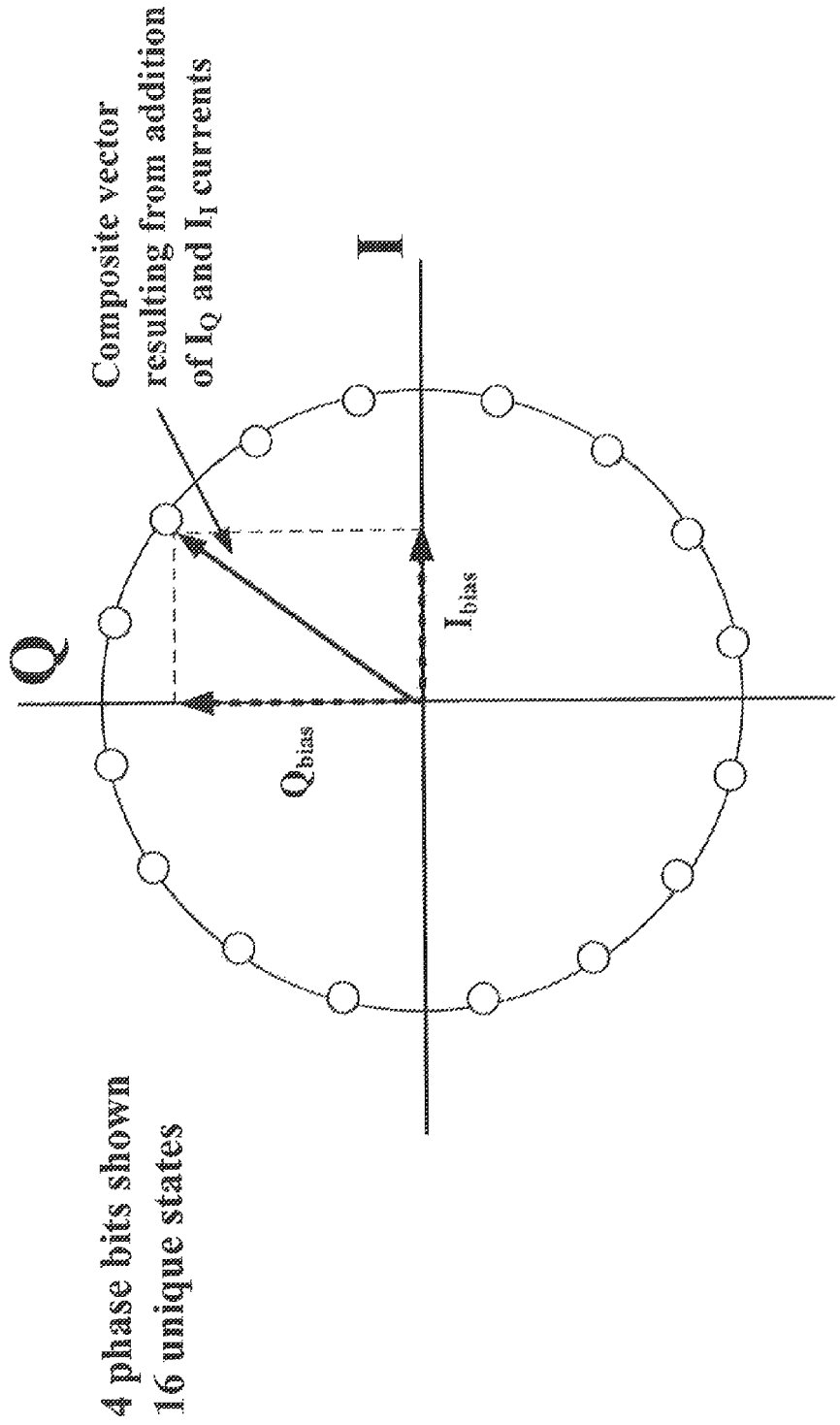
FIG. 2 illustrates a graphic representation of unique phase states in an exemplary vector generator.

In accordance with an exemplary embodiment and with reference to FIG. 2, an active vector generator may be configured to adjust the phase of a signal. The active vector generator is capable of producing a finite number of unique phase states, which is dependent on the number of phase bits of the DAC. As previously described, the vector generator receives an input signal and generates a phase adjusted composite vector. The composite vector is a combination of an I vector and a Q vector. In this embodiment, the amplitude of the composite vector is the same in each of the unique phase states. In an exemplary embodiment, the total current consumed by the I and Q vectors is constant and only the current ratio between the two vector changes. The adjustment of the current ratio using the phase states alters the phase of the composite vector, while maintaining the amplitude of the composite vector for each of the unique phase states.

Figure 3:
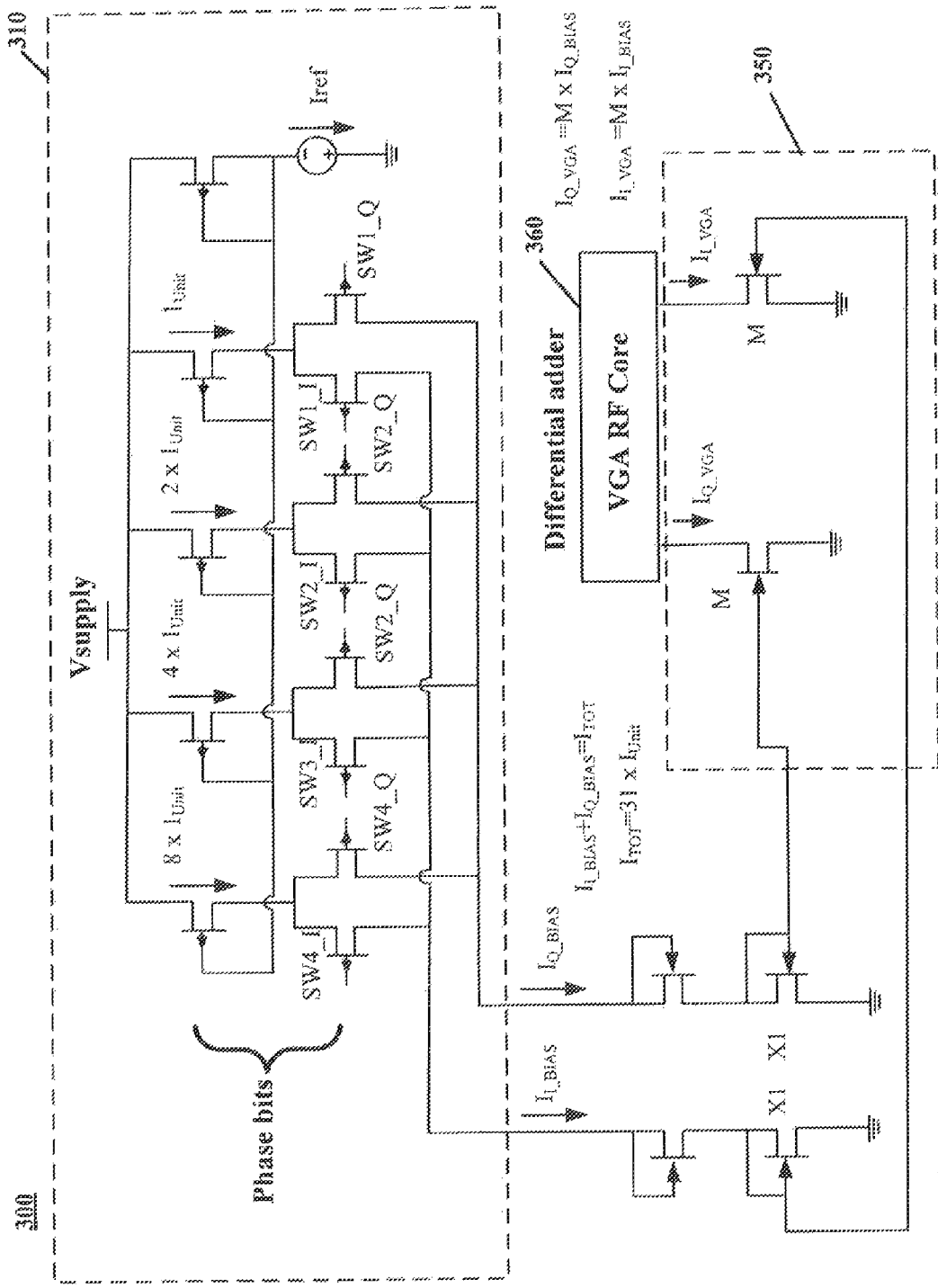
FIG. 3 illustrates a schematic of an exemplary embodiment of an active vector generator with phase control.

In an exemplary embodiment and with reference to FIG. 3, a schematic design of an active vector generator is illustrated. In an exemplary embodiment, an active vector generator 300 comprises a DAC 310 and a fixed current multiplier 350. In another exemplary embodiment, active vector generator 300 further comprises a differential adder 360. DAC 310 outputs an I bias current and a Q bias current that passes to fixed current multiplier 350 through a current mirror. In turn, fixed current multiplier 350 is connected to differential adder 360. In this embodiment, the multiplier factor of fixed current multiplier 350 is the same for the I vector and the Q vector.

In an exemplary embodiment, DAC 310 is made of a bank of transistors and corresponding switches that is controlled by phase bits. For example, FIG. 3 shows four phase bits and four corresponding switches. However, an exemplary DAC 310 may comprise any number of phase bits and corresponding switches. Furthermore, Iref is a current source that establishes a reference current that is mirrored to the bank of transistors whose peripheries vary in binary fashion. Although the bank of transistors has the peripheries varied in binary fashion, any method of varying the peripheries may be employed. In an exemplary embodiment, DAC 310 adjusts the current ratio between the I and Q vectors based on the phase bits. The switches in the DAC are controlled by the input phase bits. Specifically, the switches of DAC 310 are controlled by the phase bits and whether the current from the binary units are added to the bias currents. Moreover, the bias currents are supplied to the gates of the FETs in fixed current multiplier 350.

In an exemplary embodiment, fixed current multiplier 350 multiplies the current ratios by the same amount for both the I vector and the Q vector. This preserves the amplitude ratio between the I and Q vectors and thus keeps the resultant phase constant. The multiplied I vector and Q vector are communicated to differential adder 360. In an exemplary embodiment, both the I vector and the Q vector are multiplied by 'M' before being applied to differential adder 360. 'M' is the amplitude ratio of the final transistor peripheries in relation to the current mirrors.

In an exemplary embodiment, differential adder 360 is the same as VGAs 120, 121 and current summer 140 of vector generator 100. Furthermore, differential adder 360 can be any component that controls which quadrant the composite vector is in and combines two signals. In other words, differential adder 360 is configured to add the I vector and Q vector, or add an inverted I vector or an inverted Q vector. There is no variable amplitude control in this embodiment; the amplitude of the composite vector remains the same in each unique phase state.

Figure 4:
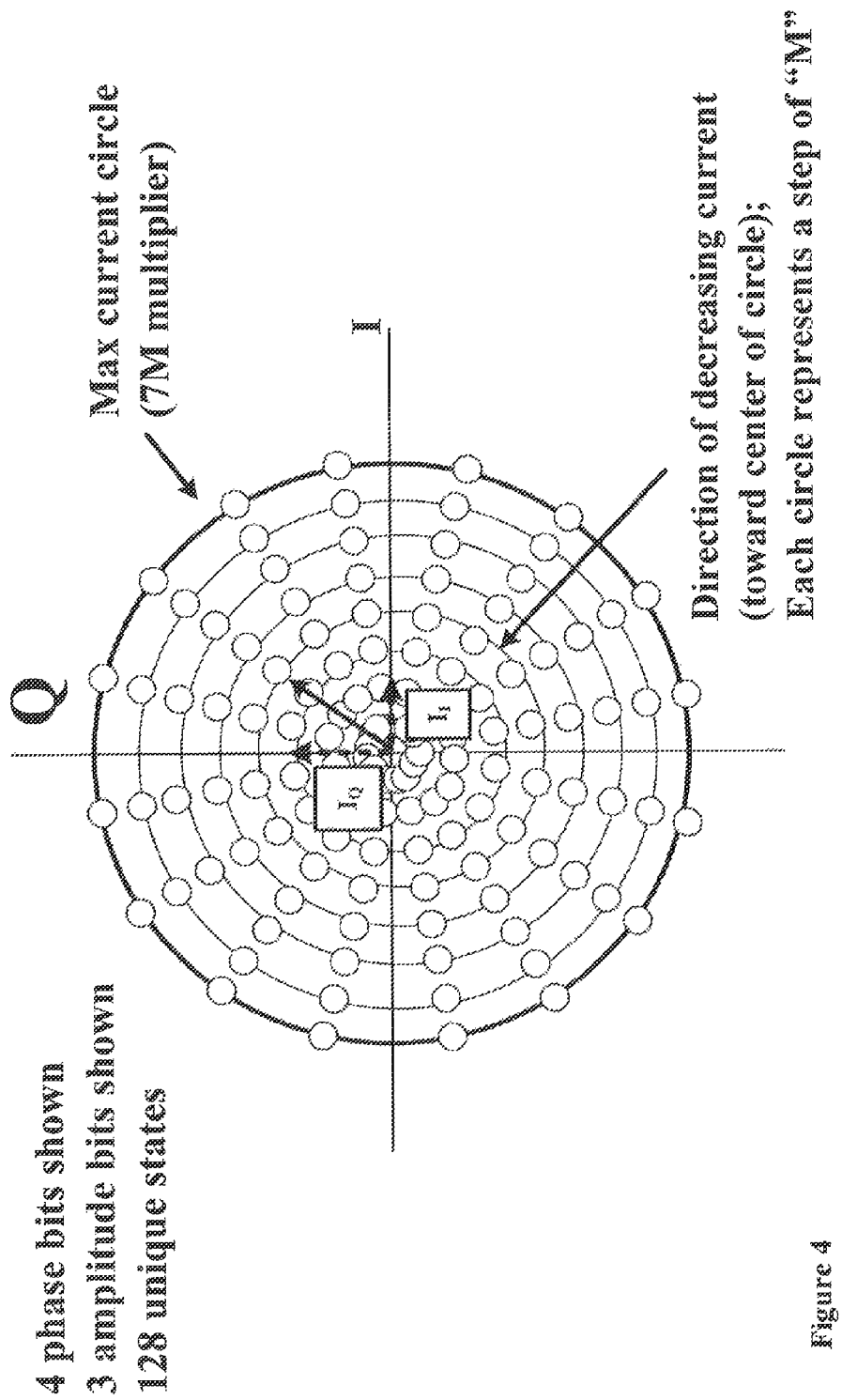
FIG. 4 illustrates a graphic representation of unique phase and amplitude states in an exemplary vector generator.

In accordance with an exemplary embodiment and with reference to FIG. 4, the graph illustrates an active vector generator with independent phase control and independent amplitude control. As with FIG. 2, there are a limited number of unique phase states, which is dependent on the number of control bits. Specifically, the number of phase states is still controlled by the number of phase bits of the DAC. However, in the exemplary embodiment, independent amplitude control allows for the adjusting of the composite vector's amplitude. The number of unique amplitude states is controlled by the number of amplitude bits.

Figure 5:
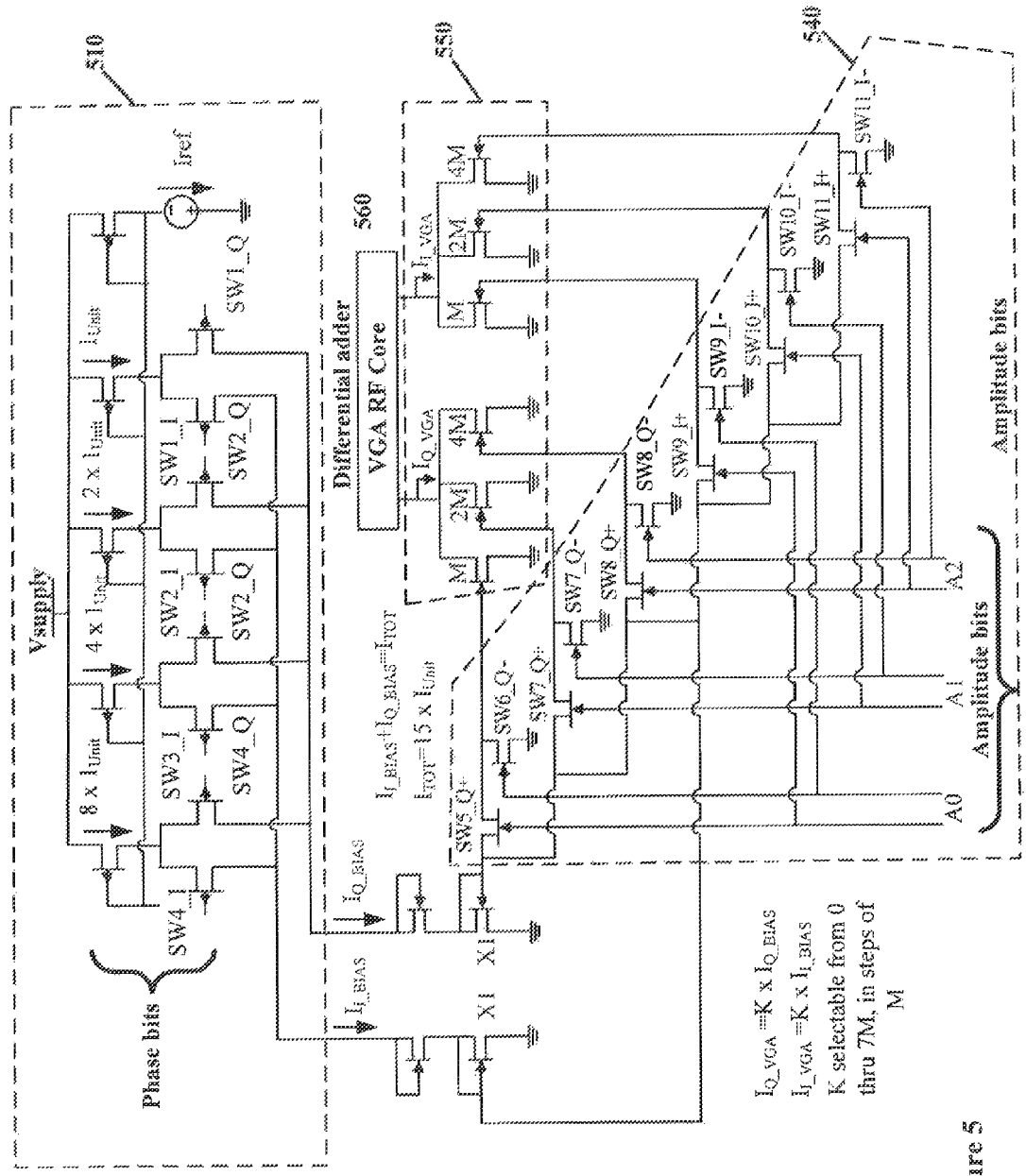
FIG. 5 illustrates a schematic of an exemplary embodiment of an active vector generator with phase and amplitude control.

In an exemplary embodiment and with reference to FIG. 5, an active vector generator 500 comprises a DAC 510, a current multiplying switch network 540, a variable current multiplier 550, and a differential adder 560. DAC 510 generates an I bias current and a Q bias current which controls the phase of the composite vector. DAC 510 is substantially similar to DAC 310 and will not be discussed in detail. In an exemplary embodiment, the I bias current and the Q bias current pass through a current mirror and are communicated to current multiplying switch network 540. Furthermore, in an exemplary embodiment, current multiplying switch network 540 communicates the I bias current and the Q bias current to variable current multiplier 550 via different current mirror reference lines, as controlled by the amplitude bits.

Current multiplying switch network 540 is configured to implement discrete amplitude states of the composite vector of active vector generator 500. In an exemplary embodiment, current multiplying switch network 540 comprises a plurality of switches in current mirror reference lines. Each current mirror reference line is connected to the current mirror, receiving either the I bias current or the Q bias current. Furthermore, each current mirror reference line is also connected to one of digitally controlled multipliers of variable current multiplier 550. Specifically, in an exemplary embodiment, the I bias current is connected, via multiple current mirror reference lines, to each of the digitally controlled multipliers of the I vector. Similarly, in the exemplary embodiment, the Q bias current is connected, via multiple current mirror refer-ence lines, to each of the digitally controlled multipliers of the Q vector. Each of the current mirror reference lines includes a switch that completes or interrupts the signal path based on the amplitude bits. As an example, FIG. 5 shows three amplitude bits and a total of six switches in current multiplying switch network 540, three switches controlling the Q bias vector path and three switches controlling the I bias vector path to variable current multiplier 550. In one embodiment, the amplitude bit lines are single-ended in nature. In another embodiment, the amplitude bit lines are differential in nature for added control. For example, differential signaling might be employed to provide field confinement and improve isolation between lines.

In an exemplary embodiment, variable current multiplier 550 is not a fixed current multiplier but instead comprises a bank of multipliers that can be digitally controlled by the amplitude bits. In an exemplary embodiment, the I bias vector and the Q vector are communicated to the bank of digitally controlled multipliers. In an exemplary embodiment, the transistor peripheries of variable current multiplier 550 vary in size in binary fashion such that the resulting vector varies in amplitude while preserving phase information established by DAC 510. For example, three bits of amplitude control correlates to eight amplitude states per vector, namely 0 to 7M in steps of size M. However, there can any number of amplitude bits greater than two in order to obtain amplitude adjustment.

In an exemplary embodiment, differential adder 560 is the same as VGAs 120, 121 and current summer 140. The differential adder 560 controls which quadrant the composite vector is in. In other words, differential adder 560 is configured to add the I vector and Q vector, or add an inverted I vector or an inverted Q vector. There are also various advantages to having switches to several or all of the binary elements. In one exemplary embodiment, turning off or substantially reducing the DC current to differential adder 560 saves power. In another exemplary embodiment, configuring the on/off states of the switches allows for isolating various signal paths and binary elements, which may be used in array calibration. In an exemplary embodiment of array calibration, all RF paths within the array of current multiplying switch network 540 are turned off except one path. The remaining one path that is still on has the amplitude and phase response measured. In an exemplary embodiment, the amplitude and phase response data is stored in an array calibration look up table by a host system. In this fashion all RF paths may be calibrated independent of all other paths.

The following applications are related to this subject matter: U.S. application Ser. No. 12/759,123, entitled "ACTIVE BUTLER AND BLASS MATRICES," which is being filed contemporaneously herewith; U.S. application Ser. No. 12/759,043, entitled "ACTIVE HYBRIDS FOR ANTENNA SYSTEMS," which is being filed contemporaneously herewith; U.S. application Ser. No. 12/759,064, entitled "ACTIVE FEED FORWARD AMPLIFIER," which is being filed contemporaneously herewith; U.S. application Ser. No. 12/759,130, entitled "ACTIVE PHASED ARRAY ARCHITECTURE," which is being filed contemporaneously herewith; U.S. application Ser. No. 12/758,996, entitled "PRESELECTOR AMPLIFIER," which is being filed contemporaneously herewith; U.S. application Ser. No. 12/759,148, entitled "ACTIVE POWER SPLITTER," which is being filed contemporaneously herewith; U.S. application Ser. No. 12/759,112, entitled "HALF-DUPLEX PHASED ARRAY ANTENNA SYSTEM," which is being filed contemporaneously herewith; U.S. application Ser. No. 12/759, 059, entitled "MULTI-BEAM ACTIVE PHASED ARRAY ARCHITECTURE," which is being filed contemporaneously herewith; the contents of which are hereby incorporated by reference for any purpose in their entirety.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

The invention claimed is:

1. An active vector generator configured to generate a composite vector with controlled phase and amplitude, the active vector generator comprising:
   a digital-to-analog converter (DAC) configured to set the phase of the composite vector, wherein the DAC sets the phase of the composite vector by setting the amplitudes of an in-phase (I) vector and a quadrature-phase (Q) vector of the composite vector:
   a current multiplying switch network configured to control the amplitude of the composite vector;
   a variable current multiplier configured to multiply both the I and Q vectors individually by a common factor in order to scale the amplitude of the composite vector;
   a differential adder configured to control the quadrant of the composite vector and generate the composite vector by combining the I and Q vectors; and
   a digital-to-analog controller having a set of phase bits distinct from a set of amplitude bits, wherein the set of phase bits are configured to control the DAC and the set of amplitude bits are configured to control the current multiplying switch network.

2. The active vector generator of claim 1, wherein the active vector generator is configured to generate a unique number of phase states and configured to generate a unique number of amplitude states of the composite vector.

3. The active vector generator of claim 1, wherein the active vector generator is part of a phased array antenna system.

4. The active vector generator of claim 3, wherein the phased array antenna system is configured for at least one of amplitude taper for antenna sidelobe management, adaptive nulling for interference rejection, complex beam weighting, and improved array calibration.

5. The active vector generator of claim 1, wherein the active vector generator generates the composite vector with independent variable phase control and independent variable amplitude control.

6. The active vector generator of claim 1, wherein a discrete number of phase states of the composite vector is based on the set of phase bits, and wherein a discrete number of amplitude states of the composite vector is based on the set of amplitude bits.

7. The active vector generator of claim 1, wherein the variable current multiplier adjusts the amplitude of the composite vector by digitally varying bias currents supplied to the differential adder.

8. The active vector generator of claim 1, wherein the variable current multiplier has different sized peripheries in binary fashion to facilitate various amplitude gain while preserving phase information.

9. The active vector generator of claim 1, wherein the variable current multiplier comprises multiple transistors with different-sized peripheries in binary fashion.

10. The active vector generator of claim 1, wherein the variable current multiplier facilitates binary control of the amplitude of the composite vector.

11. A method of generating a composite vector with controlled phase and amplitude, the method comprising:
    determining, by a digital-to-analog, controller as controlled by a set of phase bits, a desired phase shift of the composite vector and setting the corresponding relative amplitudes of an in-phase (I) vector and a quadrature-phase (Q) vector to achieve the desired phase shift;
    determining, by a current multiplying switch network as controlled by a set of amplitude bits, a desired amplitude of the composite vector;
    multiplying, by a variable current multiplier, both the I and Q vectors individually by a common factor in order to achieve the desired amplitude while maintaining the desired phase shift of the composite vector; and
    combining, by a differential adder, the I and Q vectors to generate the composite vector having the desired phase shift and the desired amplitude.

12. The method of claim 11, wherein the composite vector is generated with independent variable phase control and independent variable amplitude control.

13. The method of claim 11, wherein a discrete number of phase states of the composite vector is based on the set of phase bits, and wherein a discrete number of amplitude states is based on the set of amplitude bits of the composite vector.

14. The method of claim 11, wherein the variable current multiplier adjusts the amplitude of the composite vector by digitally varying bias currents supplied to the differential adder.

15. The method of claim 11 wherein the variable current multiplier comprises multiple transistors with different-sized peripheries in binary fashion.

16. An active vector generator comprising:
    a digital-to-analog controller, controlled by phase bits, configured to determine a desired phase shift of a composite vector, wherein the digital-to-analog controller is configured to set the corresponding relative amplitudes of an in-phase (I) vector and a quadrature-phase (Q) vector to achieve the desired phase shift;
    a current multiplying switch network, controlled by amplitude hits, configured to determine a desired amplitude of the composite vector;
    a variable current multiplier configured to multiply both the I and Q vectors individually by a common factor in order to achieve the desired amplitude while maintaining the desired phase shift of the composite vector; and
    a differential adder configured to combine the I and Q vectors to generate the composite vector having the desired phase shift and the desired amplitude.

17. The active vector generator of claim 16, wherein the active vector generator generates the composite vector with independent variable phase control and independent variable amplitude control.

18. The active vector generator of claim 16, wherein a discrete number of phase states of the composite vector is based on the phase bits, and wherein a discrete number of amplitude states is based on the amplitude bits of the composite vector.

19. The active vector generator of claim 16, wherein the variable current multiplier adjusts the amplitude of the composite vector by digitally varying bias currents supplied to the differential adder.

20. The active vector generator of claim 16, wherein the variable current multiplier comprises multiple transistors with different-sized peripheries in binary fashion.

* * * * *

UNITED STATES PATENT AND TRADEMARK OFFICE
CERTIFICATE OF CORRECTION

PATENT NO. : 8,416,882 B2
APPLICATION NO. : 12/759113
DATED : April 9, 2013
INVENTOR(S) : Corman et al.

It is certified that error appears in the above-identified patent and that said Letters Patent is hereby corrected as shown below:

In the Claims:

In Column 8, line 50 the word "hits" should be corrected to "bits"

Signed and Sealed this
Twenty-first Day of May, 2013

Teresa Stanek Rea
*Acting Director of the United States Patent and Trademark Office*